(12) United States Patent
Bhattacharjee et al.

(10) Patent No.: US 7,895,171 B2
(45) Date of Patent: Feb. 22, 2011

(54) COMPRESSIBILITY ESTIMATION OF NON-UNIQUE INDEXES IN A DATABASE MANAGEMENT SYSTEM

(75) Inventors: Bishwaranjan Bhattacharjee, Yorktown Heights, NY (US); Lipyeow Lim, Hawthorne, NY (US); George A. Mihaila, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 12/057,055

(22) Filed: Mar. 27, 2008

(65) Prior Publication Data

US 2009/0248725 A1 Oct. 1, 2009

(51) Int. Cl.
*G06F 17/30* (2006.01)
(52) U.S. Cl. .................... 707/696; 707/803
(58) Field of Classification Search ...... 707/100–104.1, 707/696, 790–793, 803
See application file for complete search history.

(56) References Cited

U.S. PATENT DOCUMENTS

| | | | |
|---|---|---|---|
| 5,286,686 A | 2/1994 | Haig et al. | |
| 5,842,208 A * | 11/1998 | Blank et al. | ............ 1/1 |
| 5,960,194 A * | 9/1999 | Choy et al. | ............ 1/1 |
| 6,411,231 B1 | 6/2002 | Yanagiya et al. | |
| 6,631,366 B1 * | 10/2003 | Nagavamsi et al. | ......... 707/741 |
| 7,039,646 B2 * | 5/2006 | Lee et al. | ............ 707/696 |
| 2004/0230724 A1 | 11/2004 | Stager et al. | |
| 2007/0094287 A1 * | 4/2007 | Wang | ............ 707/101 |

OTHER PUBLICATIONS

Baklarz, et al., "DB2 Compression Estimation Tool—DB2 Storage Optimization ROI Calculator," IBM Information Management Software, Oct. 2006.

* cited by examiner

*Primary Examiner*—Cam-Linh Nguyen
(74) *Attorney, Agent, or Firm*—Jon A. Gibbons; Fleit Gibbons Gutman Bongini & Bianco PL

(57) ABSTRACT

A method, information processing system, and computer readable storage product estimate a compression factor. A set of key values within an index are analyzed. Each key value is associated with a record identifier ("RID") list comprising a set of RIDs. The index is in an uncompressed format and includes a total byte length. A number of RIDs associated with each key value is estimated for each key value in the set of key values. A total byte length for all RID deltas between each at least two consecutive RIDs within a RID list is estimated for each RID list based on the number of RIDs that have been determined. The total byte length estimated for each RID list is accumulated. A compression factor associated with the index is determined by dividing the total byte length that has been accumulated by the byte length of the index.

20 Claims, 5 Drawing Sheets

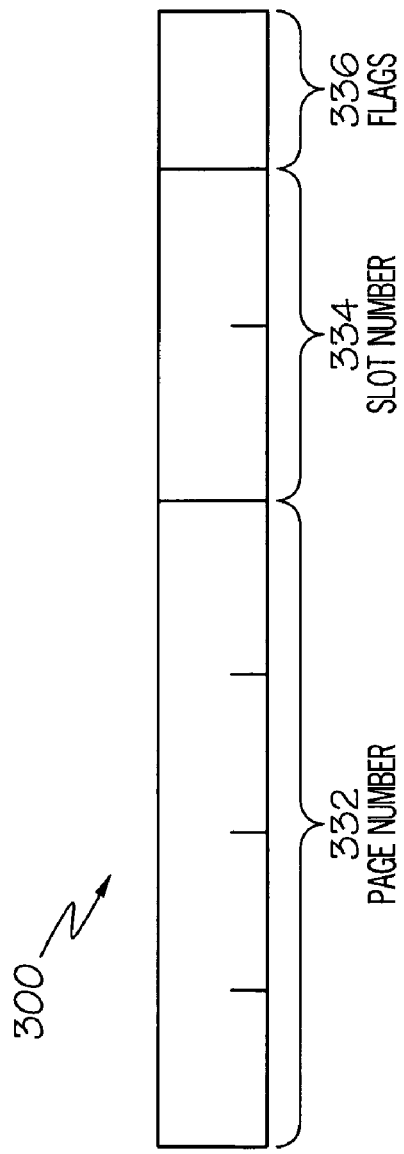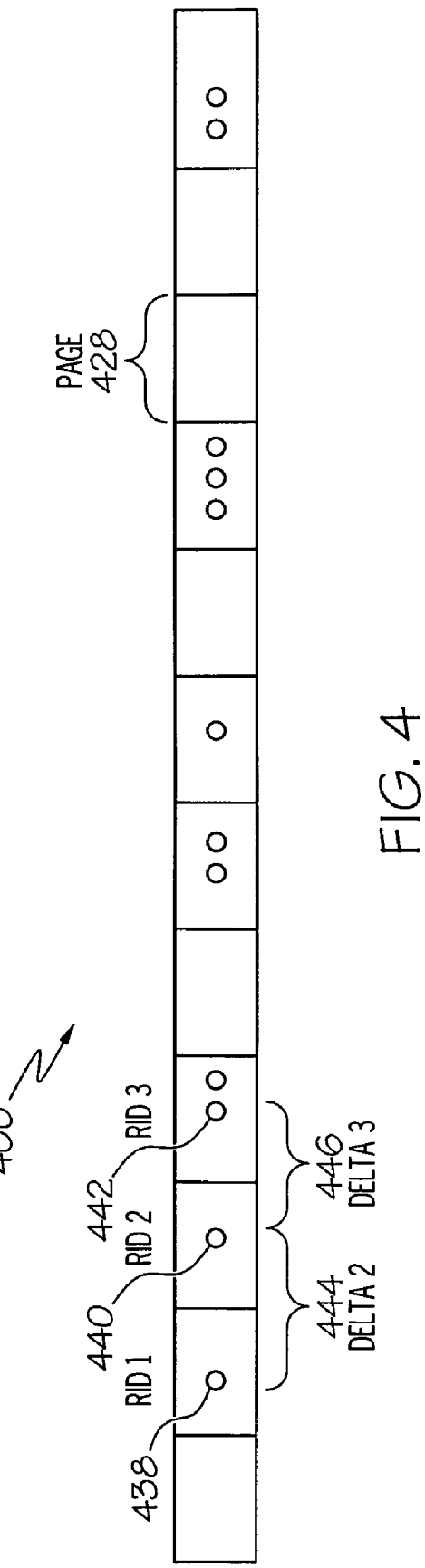

US 7,895,171 B2

COMPRESSIBILITY ESTIMATION OF NON-UNIQUE INDEXES IN A DATABASE MANAGEMENT SYSTEM

FIELD OF THE INVENTION

The present invention generally relates to the field of database management systems, and more particularly relates to estimating the compressibility of non-unique indexes in database management systems.

BACKGROUND OF THE INVENTION

In a database management system, a non-unique index over a table tends to exhibit large lists of record identifiers ("RIDs") for each distinct key value. These lists require significant storage, as each RID and additional information (such as various RID flags) can require several bytes. For example, in a database management system such as DB2v9 from International Business Machines, Inc. a RID requires 7 bytes. By applying data specific compression techniques to the RID lists (e.g., delta encoding), the size of the index can be reduced dramatically. However, before actually compressing an existing index, or creating a new index in compressed format, the database administrator needs to have an indication of what compression factor is likely to be obtained. Unfortunately, conventional database management tools generally do not provide the administrator with the ability to estimate the compression factor of the various compression techniques.

Therefore a need exists to overcome the problems with the prior art as discussed above.

SUMMARY OF THE INVENTION

In one embodiment, a method for estimating a compression factor is disclosed. The method includes analyzing a set of key values within an index. Each key value is associated with a record identifier ("RID") list comprising a set of RIDs. The index is in an uncompressed format and includes a total byte length. A number of RIDs associated with each key value is estimated for each key value in the set of key values. A total byte length for all RID deltas between each at least two consecutive RIDs within a RID list is estimated for each RID list based on the number of RIDs that have been determined. The total byte length estimated for each RID list is accumulated. A compression factor associated with the index is determined by dividing the total byte length that has been accumulated by the byte length of the index.

In another embodiment, an information processing system for estimating a compression factor is disclosed. The information processing system includes a memory and a processor that is communicatively coupled to the memory. The information processing system also includes a compressibility estimator that is communicatively coupled to both the memory and the processor. The compressibility estimator is adapted to analyze a set of key values within an index. Each key value is associated with a record identifier ("RID") list comprising a set of RIDs. The index is in an uncompressed format and includes a total byte length. A number of RIDs associated with each key value is estimated for each key value in the set of key values. A total byte length for all RID deltas between each at least two consecutive RIDs within a RID list is estimated for each RID list based on the number of RIDs that have been determined. The total byte length estimated for each RID list is accumulated. A compression factor associated with the index is determined by dividing the total byte length that has been accumulated by the byte length of the index.

In yet another embodiment, a computer readable storage medium for estimating a compression factor is disclosed. The computer readable storage product includes instructions for analyzing a set of key values within an index. Each key value is associated with a record identifier ("RID") list comprising a set of RIDs. The index is in an uncompressed format and includes a total byte length. A number of RIDs associated with each key value is estimated for each key value in the set of key values. A total byte length for all RID deltas between each at least two consecutive RIDs within a RID list is estimated for each RID list based on the number of RIDs that have been determined. The total byte length estimated for each RID list is accumulated. A compression factor associated with the index is determined by dividing the total byte length that has been accumulated by the byte length of the index.

One advantage of the present invention is that administrators are able to determine the compression factor of an index prior to compressing the index. The various embodiments of the present invention estimate the compressibility of an index by examining the key value distribution over a target table and the total table-space size. Worst case assumptions are made about the distribution of RIDs for each key value to guarantee a lower bound of compressibility. Total space requirement for storing the RID lists in a delta compressed format can then be determined. Being able to estimate the compressibility of an index is advantageous because compressing an index consumes a large number of resources. Therefore, if compressing an index is likely not going to save a great deal of disk space, saving the resources may be more beneficial.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 3 is a block diagram illustrating a record ID formation according to one embodiment of the present invention;

FIG. 4 is a block diagram illustrating delta encoding with respect to an index according to one embodiment of the present invention;

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and other similar terms as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Operating Environment

Figure 1:
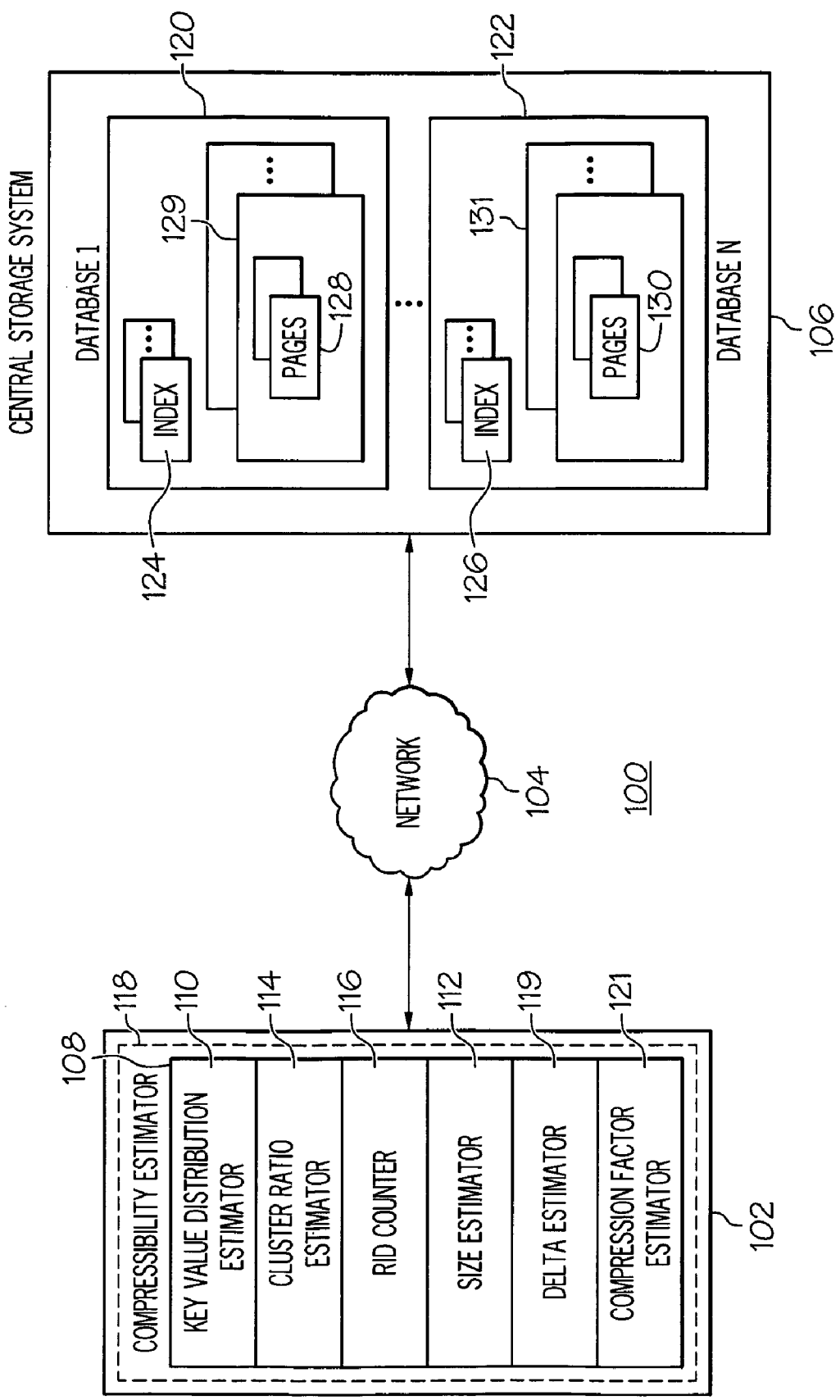
FIG. 1 is a block diagram illustrating an exemplary system according to one embodiment of the present invention.

According to one embodiment of the present invention, as shown in FIG. 1, a system 100 for estimating the compressibility of non-unique indexes is shown. In one embodiment, the system 100 includes one or more information processing systems 102, a network 104, and one or more central storage systems 106. The network 104, in one embodiment, is a wide area network, local area network, wireless network, and the like. The information processing system 102 includes a compressibility estimator 108 for estimating the compressibility of a database index. The compressibility estimator 108, in one embodiment, includes a key value distribution analyzer 110, a table space size estimator 112, a cluster ratio estimator 114, and a RID counter 116, a delta estimator 119, and a compression factor 121.

In one embodiment, the compressibility estimator 108 is part of a database management system 118 with optimized management of both relational and mark-up language data such as the DB2v9 DBMS. However, the compressibility estimator 108 and its components can also be separate from a database management system. The compressibility estimator 108, key value distribution analyzer 110, table space size estimator 112, cluster ratio estimator 114, and RID counter 116 are discussed in greater detail below. The central storage system 106, in one embodiment, includes one or more databases 120, 122 each associated with one or more indexes 124, 126, pages 128, 130, and tables 129, 131. It should be noted that the databases 120, 122, indexes 124, 126, pages 128, 130, and tables 129, 131 can also reside within the database management system 118.

The database(s) 120, 122, in one embodiment, can be hybrid databases with relational capabilities and comprehensive native support for mark-up languages such as extensible mark-up language ("XML"). It should be noted that the various embodiments of the present invention can be scaled across multiple processing nodes or can reside at a single node. It should also be noted that the compressibility estimator 108 and its components, the database management system 118, and the databases 120, 122 can all reside on a single system as well.

Information Processing System

Figure 2:
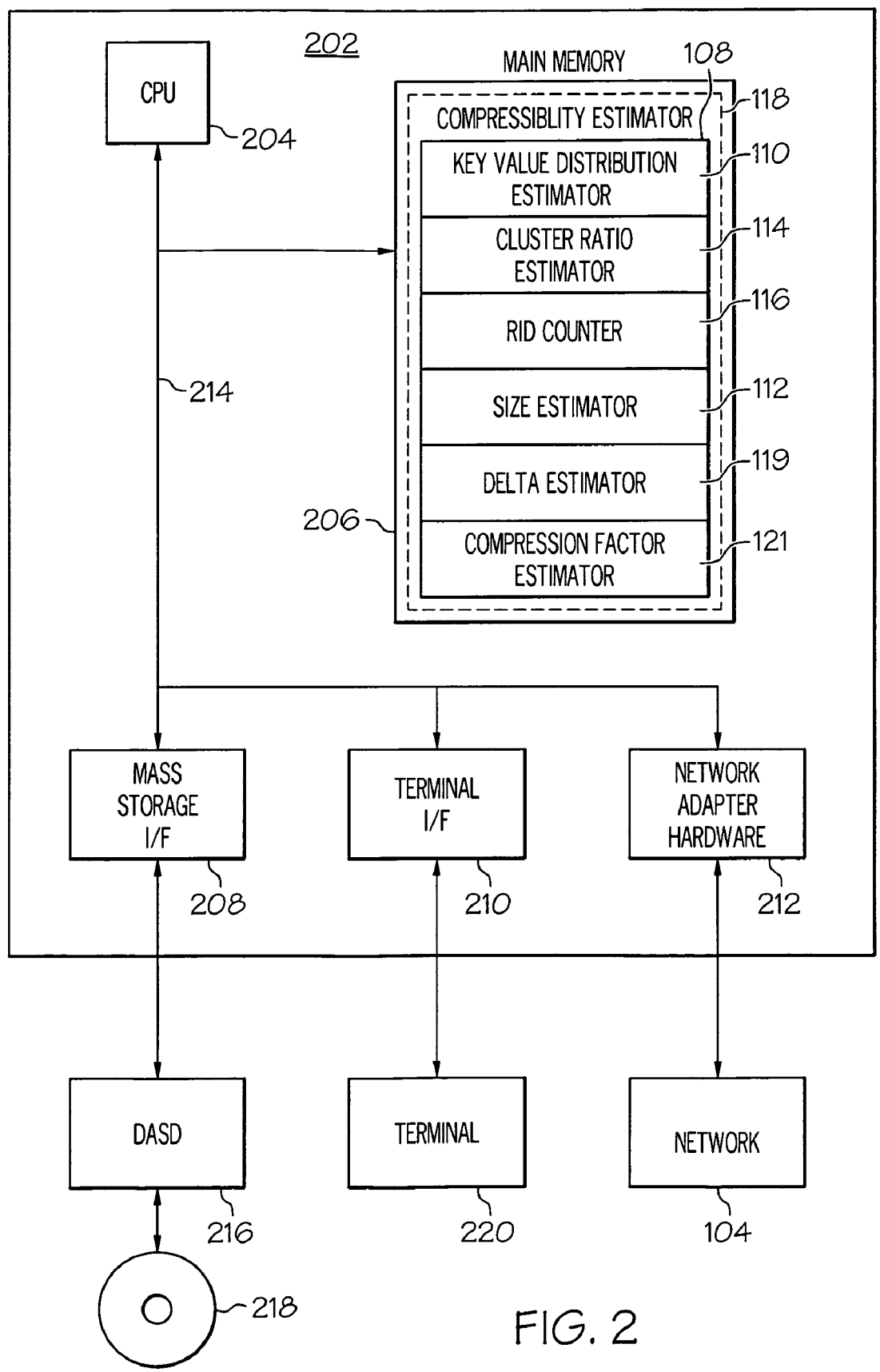
FIG. 2 is a block diagram illustrating a more detailed view of an information processing system according to one embodiment of the present invention.

FIG. 2 is a block diagram illustrating a more detailed view of the information processing system 102 according to one embodiment of the present invention. The information processing system is based upon a suitably configured processing system adapted to implement the exemplary embodiment of the present invention. Any suitably configured processing system is similarly able to be used as the information processing system 102 by embodiments of the present invention such as an information processing system residing in the computing environment of FIG. 1, a personal computer, workstation, or the like.

The information processing system 102 includes a computer 202. The computer 202 has a processor 204 that is connected to a main memory 206, mass storage interface 208, terminal interface 210, and network adapter hardware 212. A system bus 214 interconnects these system components. The mass storage interface 208 is used to connect mass storage devices, such as data storage device 216, to the information processing system 102. One specific type of data storage device is an optical drive such as a CD/DVD drive, which may be used to store data to and read data from a computer readable medium or storage product such as (but not limited to) a CD/DVD 218. Another type of data storage device is a data storage device configured to support, for example, NTFS type file system operations.

The main memory 206, in one embodiment, comprises the compressibility estimator 108, key value distribution analyzer 110, table space size estimator 112, cluster ratio estimator 114, RID counter 116, a delta estimator 119, and a compression factor 121. In one embodiment, the main memory 206 also includes the database management system 118 as well. Although illustrated as concurrently resident in the main memory 206, it is clear that respective components of the main memory 206 are not required to be completely resident in the main memory 206 at all times or even at the same time. In one embodiment, the information processing system 102 utilizes conventional virtual addressing mechanisms to allow programs to behave as if they have access to a large, single storage entity, referred to herein as a computer system memory, instead of access to multiple, smaller storage entities such as the main memory 206 and data storage device 216. Note that the term "computer system memory" is used herein to generically refer to the entire virtual memory of the information processing system 102.

Although only one CPU 204 is illustrated for computer 202, computer systems with multiple CPUs can be used equally effectively. Embodiments of the present invention further incorporate interfaces that each includes separate, fully programmed microprocessors that are used to off-load processing from the CPU 204. Terminal interface 210 is used to directly connect one or more terminals 220 to computer 202 to provide a user interface to the computer 202. These terminals 220, which are able to be non-intelligent or fully programmable workstations, are used to allow system administrators and users to communicate with the information processing system 102. The terminal 220 is also able to consist of user interface and peripheral devices that are connected to computer 202 and controlled by terminal interface hardware included in the terminal I/F 210 that includes video adapters and interfaces for keyboards, pointing devices, and the like.

An operating system (not shown) included in the main memory is a suitable multitasking operating system such as the Linux, UNIX, Windows XP, and Windows Server 2001 operating system. Embodiments of the present invention are able to use any other suitable operating system. Some embodiments of the present invention utilize architectures, such as an object oriented framework mechanism, that allows instructions of the components of operating system (not shown) to be executed on any processor located within the information processing system 102. The network adapter hardware 212 is used to provide an interface to a network 104. Embodiments of the present invention are able to be adapted to work with any data communications connections including present day analog and/or digital techniques or via a future networking mechanism.

Although the exemplary embodiments of the present invention are described in the context of a fully functional computer system, those skilled in the art will appreciate that embodiments are capable of being distributed as a program product via CD or DVD, e.g. CD 218, CD ROM, or other form of recordable media, or via any type of electronic transmission mechanism.

Estimating Index Compressibility

Database files 120, 122 store data in the rows and columns of tables 129, 131 stored on data pages 128, 130. In such a table 129, 131, the rows may correspond to individual records while the columns of the table represent attributes of the records. For example, in a customer information table of a database management system, each row might represent a different customer, while each column represents different attributes of the customers such as the name of each customer, the state where the customer resides, the amount owed by each customer and the cash receipts received from each customer.

Instead of providing for direct sorting and searching of the records in the tables, the database management system 118 relies on the index files 124, 126, which include information or pointers about the location of the records in the tables 129, 131 stored in the database files 120, 122. Indexes 124, 126 organize data records based on the value of a key. For example, an index for a customer table can be indexing on the state where a customer resides. The index, in this example, includes an entry for each state value followed by a list of RIDs for all the customers that have a particular state value.

An index 124, 126 can be searched and sorted (scanned) much more rapidly than can the database files 120, 121. An index 124, 126 is scanned through transactions in which criteria are stipulated for selecting records from a table. These criteria include keys, which are the attributes by which the database finds the desired record or records using the index. All data is stored in tables 129, 131 on a set of data pages 128, 130 that are separate from the indexes 124, 126. All of the indexes 124, 126 for a table 129, 131 include only the key values and record identifiers ("RIDs") of records including these key values.

FIG. 3 shows one example of a RID format 300. In particular, the RID format 300 includes page number information 332, slot number information 334, and a flag(s) 336. The page number information 332 indicates a page 128, 130 in the table 129, 131 where the data record associated with the RID is stored. A page 128, 130 comprises multiple data records that are distinguished by a slot number associated with teach data record. Information corresponding to the slot number is stored in the slot number section 334 of the RID format 300. The flag(s) 336 is used to indicate if the record associated with the RID has been deleted, modified, or the like. The RID comprising page number information 332, slot number information 334 and one or more flags 336 is stored within an index 124, 126, which includes multiple RIDs and flags for all records sharing the same key value. The RID format 300 shown in FIG. 3 comprises 7 bytes (4 bytes for the page number information 332, 2 bytes for the slot number information, and 1 byte for the flag 336) where each byte comprises 8 bits for a total of 56 bits.

One common type of index is a B-tree having N levels of nodes or pages. The starting node at the top of the tree is called the root node and defines the interval of key values that the B-tree index covers. In the successive lower levels of nodes before the lowest level of nodes, this key value interval is broken up into key value sub-intervals. Finally, the leaf nodes or pages in the lowest level of the tree contain the individual key values within the interval, together with the associated record (row) identifiers that enable the records having those key values as attributes to be located in the tables of the database files. The leaf pages of an index contain entries (keys) each of which is conceptually a {key-value, RID} pair where the RID is treated as if it were an extra key field.

In one embodiment, the indexes 128, 130 are non-unique indexes. A non-unique index is one that can include more than one key with the same key value. As discussed above, a non-unique index tends to include a large number of record identifiers ("RIDs") for each distinct key value. These lists require significant storage, as each RID and additional information (such as various RID flags) can require several bytes. Therefore, indexes are usually compressed to save storage space. One type of compression commonly used to compress indexes is delta compression.

Differential compression or delta compression is a way of compressing data with a great deal of similarities. Differential compression produces a delta encoding, a way of representing a version file in terms of an original file plus new information. Thus differential compression algorithms try to efficiently find common data between a reference and a version file to reduce the amount of new information which must be used. By storing the reference file and this delta encoding, the version file can be reconstructed when needed. Alternately, the reference file can be represented in terms of a version file, or each file can be represented as a set of changes of the subsequent version.

FIG. 4 shows an example of using delta compression with respect to an index. In particular, FIG. 4 shows an address space 400. The address space 400 include a plurality of pages 428 each comprising one or more RIDs 438, 440, 442. In the example of FIG. 4, each of the RIDs 438, 440, 442 are associated with the same key value. The RIDs 438, 440, 442 are not required to be clustered together, they can reside in different places within a list comprising the RID format 300 shown in FIG. 3. Therefore, the page number, slot number, and flags for each of these RIDs are also being stored.

Figure 5:
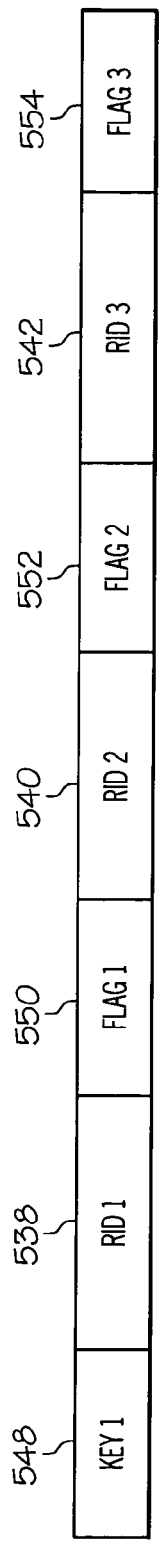
FIG. 5 is a block diagram illustrating encoding of a key value, record IDs, and record ID flags of an index in an uncompressed format according to one embodiment of the present invention.
Figure 6:
FIG. 6 is a block diagram illustrating encoding of the key value, record IDs, and record ID flags of FIG. 5 in compressed format according to one embodiment of the present invention.

A delta compression technique stores the first RID with the lowest address such as 0 and instead of storing R1, R2, and so on, the differences (deltas 444, 446) resulting from subtracting R0 from R1, R1 from R2, etc. are stored. The benefit of this method is that the resulting differences are smaller than the actual RIDs. FIG. 5 shows one example of encoding a key value 548 followed by a sorted list of RIDs 538, 540, 542 and their corresponding flags (RID flags) 550, 552, 554 in an uncompressed format. The list includes RIDs of records which match that specific key value (for example, all customer records for customers located in Florida, if this is an index on the STATE column of a CUSTOMER table). FIG. 6 displays an encoding of a key value 648. The key value 648 is followed by a compressed list of record identifiers, which includes the first (smallest) RID 638 stored as is, followed by its flags 650, followed by the difference 644 between the first RID 638 and the second RID (e.g. 440), followed by the flags 652 of the second RID, followed by the difference 646 between the second RID (e.g. 440) and the third RID (e.g., 442), followed by the flags 654 of the third RID, and so on. Since the original list was sorted, all the RID differences (deltas) are positive numbers.

Figure 7:
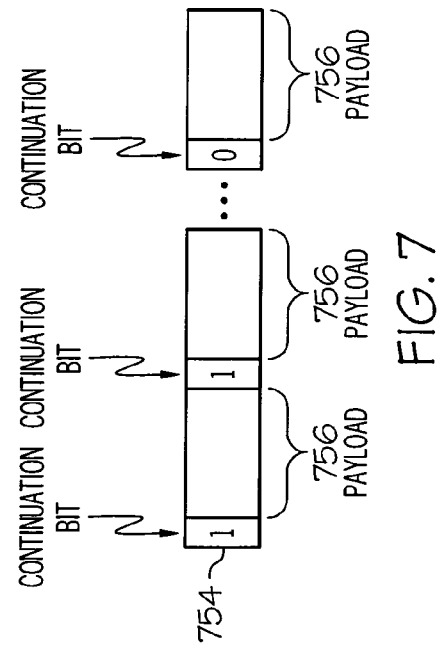
FIG. 7 is a block diagram illustrating a delta format comprising continuation bits and payload according to one embodiment of the present invention.

Because allocating the maximum number of bytes that can be used is inefficient, a variable byte encoding of the differences (e.g., the deltas) is determined by reserving the most significant bit of each byte. These bits can be referred to as continuation bits that indicate if any more bytes belonging to the same delta exist. FIG. 7 shows a delta format comprising the continuation bit 754 and the payload 756.

As can be seen compressing an index using delta compression methods is useful for minimizing storage space of an index. However, performing index compression operations are very resource intensive. Therefore, it would be advantageous for an administrator to be able to determine the compressibility of an index. For example, an administrator may want to know if an index is not able to be compressed more than a given threshold so that he/she can save resources that would be used to perform the compression. However, as discussed above, conventional database management tools generally do not provide the administrator with the ability to estimate the compression factor of the various compression techniques.

Therefore, the various embodiments of the present invention estimate the compressibility of indexes to provide administrators with this much needed capability. The compressibility estimator 108, in one embodiment, estimates the compressibility of an index by examining the key value distribution over a target table and the total table-space size. The compressibility estimator 108, in one embodiment, makes worst case assumptions about the distribution of RIDs for each key value and determines the total space requirement for storing the RID lists in a delta compressed format. This compressibility estimation process will now be discussed in greater detail.

The compressibility estimator 108, via the key value distribution estimator 110 determines the key value distribution over the target table associated with the indexed to be compressed. For example, Table 1 below shows one example of a key value distribution as determined by the compressibility estimator 108.

TABLE 1

| Key Value | Number of Records |
|---|---|
| A | 8 |
| B | 435 |
| C | 7 |
| D | 338 |
| E | 4873 |

As can be seen from TABLE 1, for a given index the key value distribution estimator 110 has determined that Key Value A has a distribution of 8 records; Key Value B has a distribution of 435 records; Key Value C has a distribution of 7 records; Key Value D has a distribution of 338 records; and Key Value E has a distribution of 4873 records. The key value distribution can be obtained by running a query, using statistics, and/or assuming a uniform distribution.

The compressibility estimator 108 can optionally take into account cluster ratio information. Cluster ratio information can be entered by the administrator or obtained using statistical operations, which can be performed by the compressibility estimator 108. If the cluster ratio associated with the index is high such as 100%, the index can be considered a clustering index. This indicates that all records sharing the same key value are clustered together in a set of consecutive pages in the current table space (i.e., the records are completely grouped). The cluster ratio is used as an estimation of the probability that two consecutive RIDs belong to the same page, which causes the corresponding delta to be small (e.g., the delta will require up to 2 bytes of variable byte storage). If not all of the records are clustered then some fragmentation exists.

If the cluster ratio is not provided or is unavailable, the compressibility estimator 108 assumes a worst case scenario of a non-clustered index where the RIDs associated with a given key value are equidistantly distributed in the entire table space. In other words, the index is completely fragmented. The compressibility estimator 108 then determines the magnitude of a delta using this worst case scenario assumption. The compressibility estimator 108 assumes a worst case scenario to guarantee a lower bound of compressibility. Therefore, the compressibility estimator 108 is prevented for over estimating the compressibility of an index.

The following is an example of pseudo code for a process of estimating index compressibility as performed by the compressibility estimator 108. The pseudo code is discussed in conjunction with FIG. 8, which is an operational flow diagram for performing the process of estimating index compressibility.

```
With TS as the table space size in pages
Total Size = Original Size = 0           // (Steps 804 and 806)
CR = cluster ratio                        // (if available CR is used, if not
                                            available assume no clustering)
For each key value {                      // (Step 808)
    N = the rid count for key             // (Step 810)
    CN = CR * N                           // number of clustered RIDs
    NCN = N - CN
    CRIDs = (CN - 1)*20                   // (Step 812) Factor for RIDs
                                            which will be clustered with same
                                            page
    nonCPgDlt = 8 * ceil(log2(TS/NCN)/7)  // (Step 814) Page delta for
                                            RIDs which will not be
                                            clustered
    nonCRIDs = (16 + nonCPgDlt)*(NCN - 1) // (Step 816) Factor for RIDs
                                            which .will not be clustered
```

-continued

```
Total Size += 56 + CRIDs + nonCRIDs        // (Step 818)
Original Size += 56 * N                    // (Step 820)
}
Compression Factor = Total Size / Original Size   // (Step 824).
```

Figure 8:
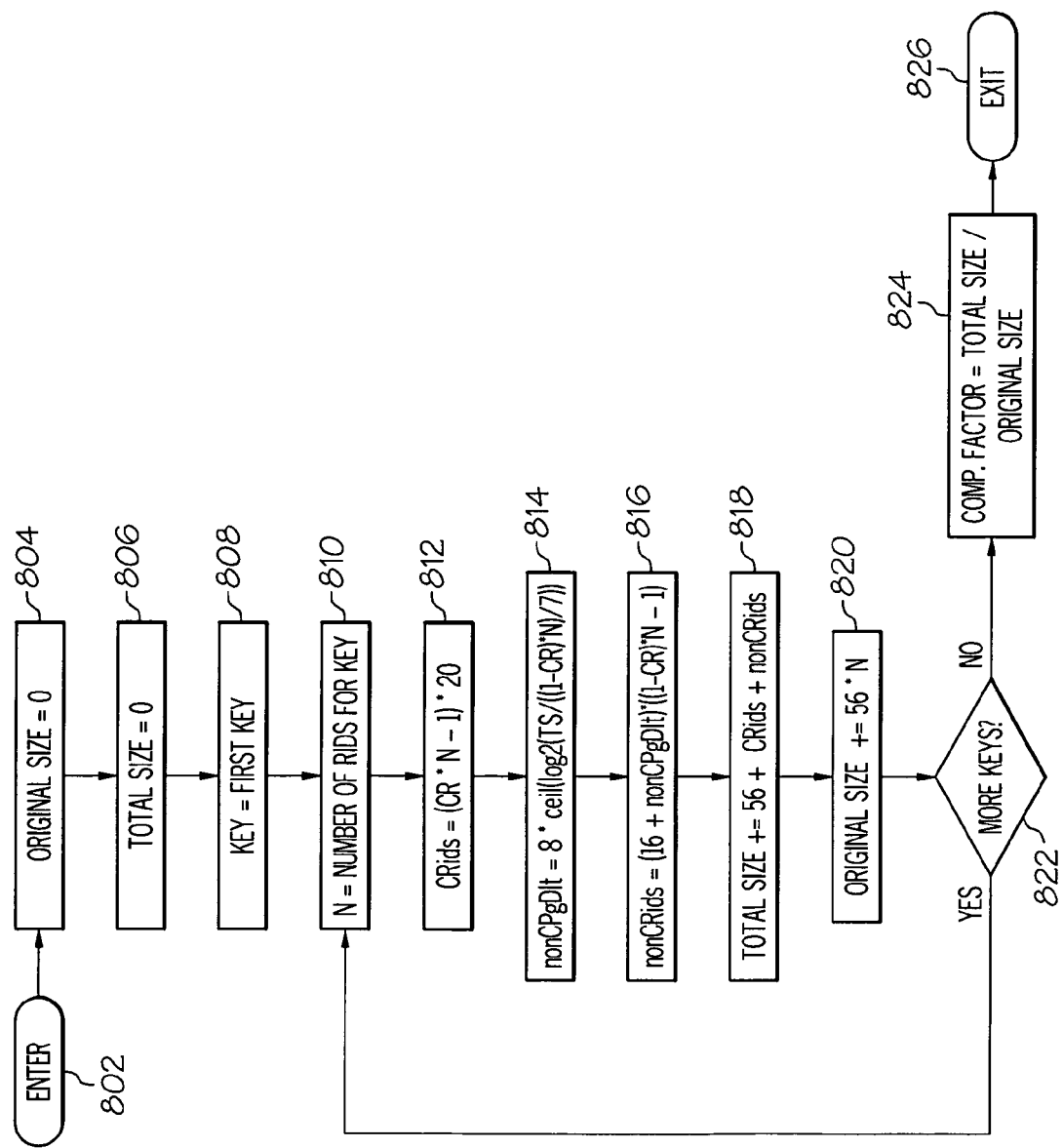
FIG. 8 is an operational flow diagram illustrating one process for estimating the compressibility of an index according to one embodiment of the present invention.

The operational flow diagram of FIG. 8 begins at step 802 and flows directly to step 804. The compressibility estimator 108 via the size estimator 112, at step 804, determines the initial size of the table space (e.g., the size of the index prior to compression) and the total size of the table space at step 806. In one embodiment, the total size is set equal to the initial size. The initial size and the total size in the example of FIG. 8 is initially set to 0. The compressibility estimator 108, at step 808, selects a key from the set of keys within the index being analyzed.

The compressibility estimator 108, at step 810, via the key value distribution estimator 110 determines the number of RIDs N for the selected key. The number of clustered records CN is determined by the compressibility estimator 108 via the cluster ratio estimator 114 by multiplying a known cluster ratio CR by the number or RIDs N. The number of non-clustered records NCN is therefore calculated as the number of RIDs N less the number of clustered records CN. As discussed above, the cluster ratio CR may not be known or is unavailable. Therefore, the compressibility estimator 108 assumes that clustering does not exist within the table space.

The compressibility estimator 108 via the delta estimator 119, at step 812, determines for the clustered records the number of bits CRIDs needed to store the delta associated with the records that are clustered together. In one embodiment, the compressibility estimator 108 determines this number of bits CRIDs by determining a factor of RIDs that will be clustered with same page e.g. at least two consecutive RIDs within a RID list. CRIDs can be calculated as the cluster ratio CR multiplied by the number of RIDs (which collectively is the number of clustered RIDs CN) minus 1. This quantity is then multiplied by a factor, which in the example of FIG. 8 is 20. The factor of 20 is determined by computing an average number of bits between 1 byte and 2 bytes since a delta can span over 2 bytes in this example, plus 8 bits for the RID flags. It should be noted that the present invention is not limited to a factor of 20. The resulting quantity indicates the number of bits CRIDs needed to store one delta associated with the records that are clustered together.

The compressibility estimator 108 via the delta estimator 119, at step 814, determines a page delta nonCPgDlt for at least two consecutive RIDs that are not clustered and the number of bits required to store the non-clustered RIDs. Because the RIDs are non-clustered and the byte length, in this example, is 8 bits, the non-clustered page count delta is equal to the byte length of 8 bits. To determine the number of bits required to store the non-clustered RIDs, the compressibility estimator 108 takes the log 2 of the table space size divided by (1−CR)*N)/7). It should be noted that the quantity (1−CR)*N is the same as N−CN. Also the table space TS divided by (1−CR)*N results in a value that is the actual difference between RIDs, i.e. a delta. The (1−CR)*N) is divided by 7 because only 7 bits are used for actual payload as shown in FIG. 7. A ceiling function is applied to (log 2(TS/ ((1−CR)*N)/7)) so that the next integer number is given (as compared to receiving a fractional value). The log 2 of (TS/ ((1−CR)*N)/7)) is taken to determine the number of bytes needed to store the non-clustered RIDs. This quantity ceil(log 2(TS/((1−CR)*N)/7)) is then multiplied by 8, which is the number of bits per byte in this example.

The compressibility estimator 108 via the delta estimator 119, at step 816, determines a factor of RIDs nonCRIDs that are not clustered. For example, the compressibility estimator 108 adds the nonCPgDlt quantity with a quantity of 16, which gives the magnitude of the delta in bits (e.g., the number of bits for each delta). The quantity of 16 is the number of bits (2 bytes=16 bits) for the slot information. This quantity (16+ nonCPgDlt) is then multiplied by ((1−CR)*N−1) (which is the number of such deltas). The compressibility estimator 108, at step 818, determines the total size by adding 56+CRIDs+nonCRIDs. The quantity 56 is the size of one uncompressed RID (in this example), which can include 48 bits for the RID and 8 bits for the RID flag. The quantity 56 is added to CRIDs and nonCRIDs because the first RID is stored in an uncompressed format. CRIDs is the number of bits used to store the portion of the RID list that are clustered and nonCRIDs is the number of bits needed to store the non-clustered RIDs.

The compressibility estimator 108 via the size estimator 112, at step 820, determines the original size by multiple 56 by N, which is the size of an uncompressed RID, multiplied by the total number of RIDs for the key. The compressibility estimator 108, at step 822, determines if any more distinct keys are left within the index. If the result of this determination is positive, the process discussed above with respect to steps 808-820 are repeated. It should be noted that if multiple keys of the same value exist in the index, only one of the keys is selected. If the result of this determination is negative, the compressibility estimator 108 via the compression factor estimator 121, at step 822 determines a compression factor associated with the index. For example, the compressibility estimator 108 takes the determined total size (which includes all of the total bits/bytes required for each key in the index) divided by the original size (which includes the original size determined for each key). The control flow then exits at step 824.

As can bee seen from the above discussion, the various embodiments of the present invention estimate the compressibility of an index by examining the key value distribution over a target table and the total table-space size, using cluster ratio information or making worst case assumptions about the distribution of RIDs to guarantee a lower bound of compressibility. The various embodiments of the present invention allow an administrator or other user to determine the total space requirement for storing the RID lists in a delta compressed format. Being able to estimate the compressibility of an index is advantageous because compressing an index consumes a large number of resources. So if compressing an index is likely not going to save a great deal of disk space, the administrator can choose to not perform the compression, thereby saving resources.

Non-Limiting Examples

The present invention can be realized in hardware, software, or a combination of hardware and software. A system according to one embodiment of the present invention can be realized in a centralized fashion in one computer system or in a distributed fashion where different elements are spread across several interconnected computer systems. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein.

In general, the routines executed to implement the embodiments of the present invention, whether implemented as part of an operating system or a specific application, component, program, module, object or sequence of instructions may be referred to herein as a "program." The computer program typically is comprised of a multitude of instructions that will be translated by the native computer into a machine-readable format and hence executable instructions. Also, programs are comprised of variables and data structures that either reside locally to the program or are found in memory or on storage devices. In addition, various programs described herein may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for estimating a compression factor, the method comprising:
   performing with a computer processor the following:
   analyzing a set of key values within an index, wherein each key value is associated with a record identifier ("RID") list comprising a set of RIDs, and wherein the index is in an uncompressed format and includes a total byte length;
   estimating, for each key value in the set of key values, a number of RIDs associated with each key value;
   estimating for each RID list, based on the number of RIDs that have been determined, a total byte length for all RID deltas between each at least two consecutive RIDs within a RID list;
   accumulating the total byte length estimated for each RID list; and
   determining a compression factor associated with the index by dividing the total byte length that has been accumulated by the byte length of the index.

2. The method of claim 1, wherein estimating a total byte length for all RID deltas between each RID within a RID list further comprises:
   determining a distribution of the RIDs within the RID list using a uniform distribution.

3. The method of claim 1, wherein estimating a total byte length for all RID deltas between each the at least two consecutive RIDs within a RID list is based on a cluster ratio associated with RIDs within the RID list.

4. The method of claim 3, wherein the cluster ratio is one of:
   a measured clustered ratio; and
   a constant clustered ratio.

5. The method of claim 3, wherein the cluster ratio is determined using a statistical model that models a distribution of the RIDS within the RID list.

6. The method of claim 5, wherein estimating a total byte length for all RID deltas between each RID within a RID list further comprises:
   setting, for each key value in the set of key values, the number of RIDs associated with each key value equal to each other; and
   estimating the total byte length for all RID deltas between each two consecutive RIDs within a RID list based on the number of RIDs associated with each key value, which have been set equal to each other, and the statistical model.

7. The method of claim 5, wherein estimating a total byte length for all RID deltas between each RID within a RID list further comprises:
   setting, for each key value in the set of key values, the number of RIDs associated with each key value equal to each other; and
   estimating the total byte length for all RID deltas between each two consecutive RIDs within a RID list based on the number of RIDs associated with each key value, which have been set equal to each other, the statistical model, and a distribution of the RIDs within the RID list using a uniform distribution.

8. The method of claim 1, wherein estimating, for each key value in the set of key values, a number of RIDs associated with each key value further comprises:
   running a query to determine an exact number of RIDs associated with each key value.

9. The method of claim 1, wherein estimating, for each key value in the set of key values, a number of RIDs associated with each key value further comprises:
   determining an exact number of RIDs associated with only a top k most frequent key values;
   applying a uniform distribution to a remaining set of key values to determine a number of RIDs associated with each key value in the remaining set of key values.

10. An information processing system for estimating a compression factor, the information processing system comprising:
    a memory;
    a processor communicatively coupled to the memory; and
    a compressibility estimator communicatively coupled to the memory and the processor, wherein the compressibility estimator is adapted to:
    analyze a set of key values within an index, wherein each key value is associated with a record identifier ("RID") list comprising a set of RIDs, and wherein the index is in an uncompressed format and includes a total byte length;
    estimate, for each key value in the set of key values, a number of RIDs associated with each key value;
    estimate for each RID list, based on the number of RIDs that have been determined, a total byte length for all RID deltas between each at least two consecutive RIDs within a RID list;
    accumulate the total byte length estimated for each RID list; and
    determine a compression factor associated with the index by dividing the total byte length that has been accumulated by the byte length of the index.

11. The information processing system claim 10, wherein estimating, for each key value in the set of key values, a number of RIDs associated with each key value further comprises:

running a query to determine an exact number of RIDs associated with each key value.

12. The information processing system of claim 10, wherein the compressibility estimator estimates the total byte length for all RID deltas between each the at least two consecutive RIDs within a RID list based on a cluster ratio associated with RIDs within the RID list.

13. The information processing system of claim 10, wherein estimating a total byte length for all RID deltas between each RID within a RID list further comprises:

setting, for each key value in the set of key values, the number of RIDs associated with each key value equal to each other; and estimating the total byte length for all RID deltas between each two consecutive RIDs within a RID list based on the number of RIDs associated with each key value, which have been set equal to each other, and a statistical model that is used to determine a cluster ratio associated with RIDs within the RID list, wherein the statistical model models a distribution of the RIDS within the RID list.

14. The information processing system of claim 10, wherein estimating a total byte length for all RID deltas between each RID within a RID list further comprises:

setting, for each key value in the set of key values, the number of RIDs associated with each key value equal to each other; and estimating the total byte length for all RID deltas between each two consecutive RIDs within a RID list based on the number of RIDs associated with each key value, which have been set equal to each other, a statistical model that model models a distribution of the RIDS within the RID list, and a distribution of the RIDs within the RID list using a uniform distribution.

15. The information processing system of claim 10, wherein estimating, for each key value in the set of key values, a number of RIDs associated with each key value further comprises:

determining an exact number of RIDs associated with only a top k most frequent key values;

applying a uniform distribution to a remaining set of key values to determine a number of RIDs associated with each key value in the remaining set of key values.

16. A computer readable storage product for estimating a compression factor, the computer readable storage product comprising instructions for:

analyzing a set of key values within an index, wherein each key value is associated with a record identifier ("RID") list comprising a set of RIDs, and wherein the index is in an uncompressed format and includes a total byte length;

estimating, for each key value in the set of key values, a number of RIDs associated with each key value;

estimating for each RID list, based on the number of RIDs that have been determined, a total byte length for all RID deltas between each at least two consecutive RIDs within a RID list;

accumulating the total byte length estimated for each RID list; and determining a compression factor associated with the index by dividing the total byte length that has been accumulated by the byte length of the index.

17. The computer readable storage product of claim 16, wherein the estimating a total byte length for all RID deltas between each the at least two consecutive RIDs within a RID list is based on a cluster ratio associated with RIDs within the RID list.

18. The computer readable storage product of claim 16, wherein estimating a total byte length for all RID deltas between each RID within a RID list further comprises:

setting, for each key value in the set of key values, the number of RIDs associated with each key value equal to each other; and estimating the total byte length for all RID deltas between each two consecutive RIDs within a RID list based on the number of RIDs associated with each key value, which have been set equal to each other, and a statistical model that is used to determine a cluster ratio, wherein the statistical model models a distribution of the RIDS within the RID list.

19. The computer readable storage product of claim 16, wherein estimating a total byte length for all RID deltas between each RID within a RID list further comprises:

setting, for each key value in the set of key values, the number of RIDs associated with each key value equal to each other; and estimating the total byte length for all RID deltas between each two consecutive RIDs within a RID list based on the number of RIDs associated with each key value, which have been set equal to each other, a statistical model models a distribution of the RIDS within the RID list, and a distribution of the RIDs within the RID list using a uniform distribution.

20. The computer readable storage product of claim 16, wherein the instructions for estimating, for each key value in the set of key values, a number of RIDs associated with each key value further comprise instructions for:

determining an exact number of RIDs associated with only a top k most frequent key values;

applying a uniform distribution to a remaining set of key values to determine a number of RIDs associated with each key value in the remaining set of key values.

* * * * *